United States Patent

Misra et al.

[11] Patent Number: 6,048,406
[45] Date of Patent: Apr. 11, 2000

[54] BENIGN METHOD FOR ETCHING SILICON DIOXIDE

[75] Inventors: Ashutosh Misra, Dallas; Jagdish Prasad, Denton; Jennifer A. Sees, The Colony; Lindsey H. Hall, Dallas, all of Tex.

[73] Assignee: Texas Instruments Incorporated, Dallas, Tex.

[21] Appl. No.: 09/057,358

[22] Filed: Apr. 8, 1998

Related U.S. Application Data

[60] Provisional application No. 60/043,759, Apr. 8, 1997.

[51] Int. Cl.[7] ........................................ C23F 1/00
[52] U.S. Cl. ........................... 134/2; 134/3; 216/96; 216/99; 252/79.3
[58] Field of Search ................ 134/2, 3; 216/96, 216/99; 252/79.1, 79.2, 79.3

[56] References Cited

U.S. PATENT DOCUMENTS

| | | | |
|---|---|---|---|
| 3,607,480 | 9/1971 | Harrap et al. | 156/17 |
| 3,629,667 | 12/1971 | Lubart et al. | 317/234 |
| 5,268,069 | 12/1993 | Chappel-Sokol et al. | 156/646 |
| 5,571,447 | 11/1996 | Ward et al. | 510/206 |

*Primary Examiner*—Richard Bueker
*Assistant Examiner*—Alva C Powell
*Attorney, Agent, or Firm*—Robby T. Holland; Carlton H. Hoel; Frederick J. Telecky, Jr.

[57] ABSTRACT

Traditionally, hydrofluoric acid (HF) or buffered bydrofluoric acid ($NH_4F$) is mixed with water to form a etching solution for cleaning silicon dioxide from semiconductor wafer surfaces. An etching solution formed by mixing ammonium hydrogen bifluoride ($(NH_4)HF_2$) with water provides a benign alternative for cleaning silicon dioxide.

8 Claims, 1 Drawing Sheet

BENIGN METHOD FOR ETCHING SILICON DIOXIDE

This is a Non Provisional application filed under 35 USC 119(e) and claims priority of prior provisional Ser. No. 60/043,759 of inventor Misra, et al., filed Apr. 8, 1997.

FIELD OF THE INVENTION

The invention relates generally to the field of manufacturing integrated circuits and relates more specifically to etching or cleaning silicon dioxide ($SiO_2$) from the surface of a silicon substrate.

BACKGROUND OF THE INVENTION

In manufacturing integrated circuits, it is common to form a dielectric layer on the surface of a silicon wafer and then pattern the wafer by removing portions of the dielectric layer. One widely used dielectric layer is silicon dioxide. Silicon dioxide will also form on the surface of a silicon substrate that is exposed to air. This is typically referred to as a "native" $SiO_2$ layer. Native oxides are undesirable as they inhibit subsequent processing of the wafer and therefore must be removed. One way to pattern silicon dioxide and to remove native oxides is by wet cleaning (etching). As explained in the book entitled *Semiconductor Integrated Circuit Processing Technology* by W. R. Runyan and K. E. Bean, Copyright 1990 by Addison-Wesley Publishing Company Inc., on pages 264–267, hydrofluoric acid (HF) in various dilutions in water and often buffered with ammonium fluoride ($NH_4F$) is the standard silicon dioxide wet etchant. (The buffer ratio for oxide etching with HF generally means the volume ratio of a solution of 40% by weight $NH_4F$ in water to 49% HF.) In dilute water solutions, HF will partially dissociate and give $$HF \rightarrow F^- + HF_2^-$$ 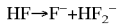

Much research indicates that $HF_2^-$ species is responsible for etching silicon dioxide. See H. Kikuyama, N. Miki, K. Saka, J. Takano, I. Kawanabe, M. Miyashita and T. Ohmi, Principles of Wet Chemical Processing in ULSI Microfabrication, *IEEE Transactions on Semiconductor Manufacturing,* Vol. 4, No. 1, February 1991, pp. 26–35. See also H. Proksche, G. Nagorsen and D. Ross, The Influence of $NH_4F$ on the Etch Rates of Undoped $SiO_2$ in Buffered Oxide Etch, *Journal of the Electrochemical Society,* Vol. 139, No. 2, February 1992, pp. 521–524.

While having advantages as an etchant, hydrofluoric acid is a highly toxic and corrosive chemical, posing severe safety and health constraints, especially for uses which employ HF at elevated temperatures. Toxic HF vapors at room temperatures pose health risk; toxic HF vapors at high temperatures also promote corrosion of instruments in addition to the health risk. Since buffered hydrofluoric acid (BHF) contains only a very small amount of hydrofluoric acid, the health concerns associated with it are lesser, but the large amount of fluorine containing species generated in the formulation is an environmental risk.

U.S. Pat. No. 5,268,069 issued Dec. 7, 1993 to Chapple-Sokol et al. entitled "Safe Method For Etching Silicon Dioxide" teaches using anhydrous ammonium fluoride ($NH_4F$) as a source of hydrofluoric acid. Specifically, the patent proposes heating the anhydrous ammonium fluoride to above its sublimation temperature of 100° C. to formulate the reaction:

$$NH_4F_{(c)} \rightarrow HF_{(g)} + NH_{3(g)}$$ 

Hence, Chapple-Sokol et al.'s method ultimately produces the same species as hydrofluoric acid produces in aqueous medium, since it utilizes controlled amounts of water vapor to mix with the ammonium fluoride vapors. Their method is safer than traditional hydrofluoric acid etch since the starting material is less toxic and easier to handle. However, Chapple-Sokol et al.'s method is disadvantageous due to the elevated heating temperature necessary to formulate the reaction and due to the time and expense necessary to heat the anhydrous ammonium fluoride. What is needed is an oxide etch chemistry which has safety benefits over the traditional HF wet etch and also has economic and time benefits over U.S. Pat. No. 5,268,069 to Chapple-Sokol et al.

It is accordingly an object of this invention to provide an etch chemistry for silicon oxide that is both benign and easy to use.

Other objects and advantages of the invention will be apparent to those of ordinary skill in the art having the benefit of the following description and drawing figures.

SUMMARY OF INVENTION

An aqueous solution of ammonium hydrogen bifluoride (($NH_4$)$HF_2$) is a benign alternative to hydrofluoric acid and buffered hydrofluoric acid for wet etching silicon oxide which is used in manufacturing integrated circuits.

DETAILED DESCRIPTION OF PREFERRED EMBODIMENT

Figure 1:
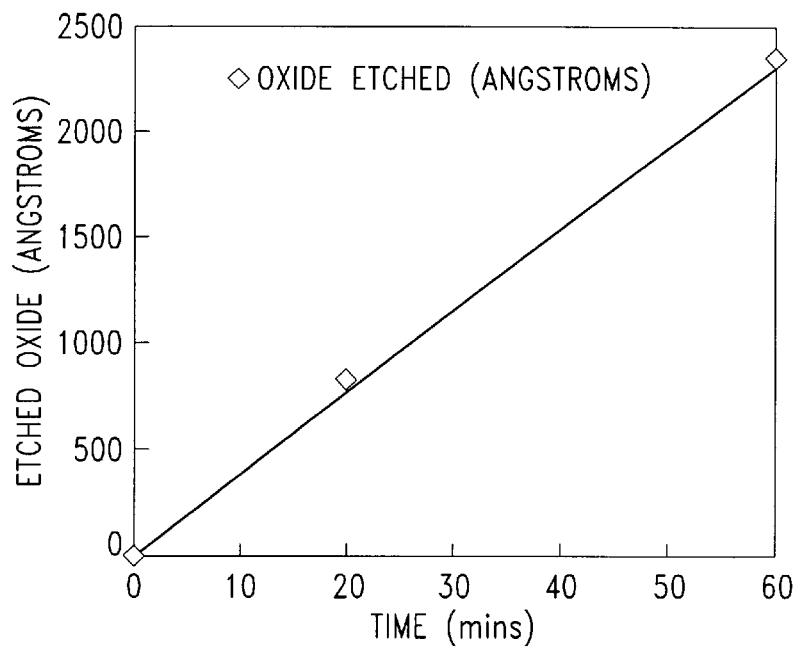
FIG. 1 is a plot illustrating oxide etch rate versus time for 0.49% ($NH_4$)$HF_2$.

An aqueous solution of ammonium hydrogen bifluoride (NH)$HF_2$ is a benign suitable alternative to hydrofluoric acid and buffered hydrofluoric acid. In aqueous solutions ammonium hydrogen bifluoride dissociates to give $HF_2^-$ ions, which are the primary species in the mechanism of etching $SiO_2$. While this solution will have the same "contact" toxicity as HF at a given fluoride concentration, it has a tremendous advantage over HF in that it produces no fluorine containing vapors near room temperature or at modestly elevated temperatures. Ammonium hydrogen bifluoride is a readily available chemical, is inexpensive, and is highly soluble in water at room temperature so that desired concentrations of aqueous solutions can be made easily and quickly. This allows for easy transportation of the solid ammonium hydrogen bifluoride to the semiconductor wafer fabs, without the risking the kind of health hazards associated with HF: required amount of water can be added in the wafer fab to produce solutions of desired concentration used in the specific application. ($NH_4$)$HF_2$ is different than HF in that it produces the chemical species required for etching silicon dioxide, $HF_2^-$, without relying upon hydrofluoric acid at any step.

The aqueous ($NH_4$)$HF_2$ formulation will also be a significant improvement over conventional BHF from an environmental standpoint since the total quantity of fluorine containing species would be substantially smaller—leading to reduced waste treatment and greener fabs. Replacing BHF with ($NH_4$)$HF_2$ will additionally yield considerable cost savings as ammonium hydrogen bifluoride is relatively inexpensive compared to BHF. Even more substantial cost savings can be achieved if the ammonium hydrogen bifluoride is produced locally near the semiconductor fabrication facility such as by using a generator.

($NH_4$)$HF_2$ is also advantageous over Chapple-Sokol et. al's U.S. Pat. No. 5,268,069) use of heated anhydrous ammonium fluoride, (over its sublimation temperature), as a source of hydrogen fluoride. Chapple-Sokol et al. ultimately produces the same etchant species as hydrofluoric acid produces in aqueous medium, since Chappel-Sokol et al. utilizes controlled amounts of water vapor to mix with the ammonium fluoride vapors. The advantageous ammonium hydrogen bifluoride herein, however, is based on an entirely different approach: the goal is not to generate hydrofluoric acid, but is to directly produce the $HF_2^-$ species which is responsible for etching silicon dioxide. These species are directly produced upon the dissolution of ammonium hydrogen bifluoride in water according to the reaction given below

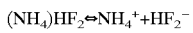

Applicants' method is advantageous over Chapple-Sokol et al.'s method since applicants' method of producing the oxide etching species does not require heating at any step. The mixing of ammonium hydrogen bifluoride with water may advantageously occur at room temperature: this saves considerable resources and makes the process much easier and safer to use.

Experiments were conducted which show that the etch rates for silicon dioxide films using solutions of ammonium hydrogen bifluoride mixed with water are comparable to the etch rates obtained with conventional buffered hydrofluoric acid. Silicon dioxide films, with an initial thickness of approximately 15000 Å were formed on 150 mm, P<100> type silicon wafers using the commonly used recipe for growing plasma enhanced TEOS (PETEOS) films. The wafers were placed into a vat containing liquid etching solutions maintained at room temperature. The etch solutions containing ($NH_4$)$HF_2$ were prepared by transporting solid ammonium hydrogen bifluoride to the vat and adding the appropriate amount of water. For the 0.49% and 4.9% ($NH_4$)$HF_2$ solutions used in this study, the following mixing recipes were used:

0.49% ($NH_4$)$HF_2$ solution: dissolve 2.45 g solid ($NH_4$)$HF_2$ in 500 ml of deionized water, stir thoroughly until all solid is dissolved.

4.9% ($NH_4$)$HF_2$ solution: dissolve 24.5 g solid ($NH_4$)$HF_2$ in 500 ml of deionized water, stir thoroughly until all solid is dissolved.

The table below shows the various etch chemistries and etch rate of silicon dioxide. The concentrations (in percentages) shown below reflect the most common concentrations used in semiconductor processing and cover a broad range (from 0.49% to 4.9%). The purpose is to show that the ($NH_4$)$HF_2$ chemistry offers etch rates at room temperature which are comparable with the traditional chemistries, and it is anticipated that similar results will be obtained for other variations in concentrations which are employed in semiconductor manufacturing.

The thickness of the silicon oxide films were measured using a PROMETRIX FT-750 instrument prior to and following the etching. The amount of silicon oxide etched during a known time interval affords the calculation of etch rates (given in Å/min), which are shown in Table 1. below.

TABLE 1

Etch rates of silicon dioxide films using various etch chemistries

| Etch Chemistry | Etch rate of silicon dioxide (Å/min) |
|---|---|
| 0.49% HF | 30 |
| 0.49% BHF | 75 |
| 0.49% ($NH_4$)$HF_2$ solution | 39 |
| 4.9% HF | 330 |
| 4.9% BHF | 800 |
| 4.9% ($NH_4$)$HF_2$ solution | 600 |

Figure 2:
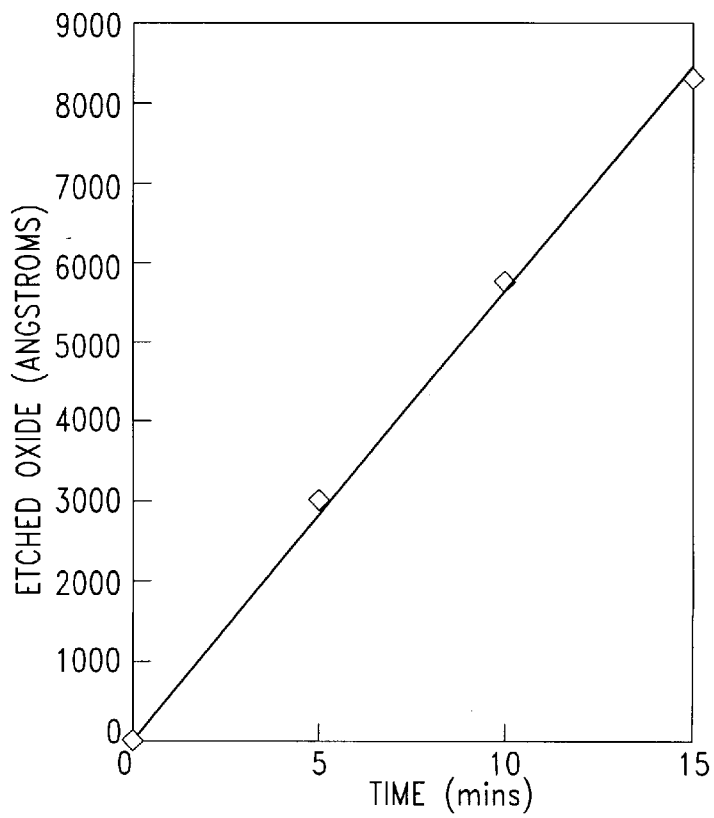
FIG. 2 is a plot illustrating oxide etch rate versus time for 4.9% ($NH_4$)$HF_2$.

FIG. 1 is a graph illustrating the amount of silicon dioxide etched as a function of time for 0.49% aqueous solutions of ($NH_4$)$HF_2$ while FIG. 2 is a graph illustrating the amount of silicon dioxide etched as a function of time for 4.9% aqueous solutions of ($NH_4$)$HF_2$. Both FIGS. 1 and 2 show that the etch rate proceeds in a linear fashion with time which indicates a relative constant etch rate that is very desirable in semiconductor processing.

The proposed ($NH_4$)$HF_2$ chemistry does not etch silicon nitride films: this was verified in experiments which utilized 150 mm, P<100> wafers that had 2000 Å of thermally grown silicon nitride films. Upon placing such wafers in the etching solution, no etching of silicon nitride films was observed. Thus, ($NH_4$)$HF_2$ offers a way of selectively etching silicon oxide films, without affecting the silicon nitride films and can therefore be used in several semiconductor manufacturing applications where such selectivity is very critical.

An additional advantage of ($NH_4$)$HF_2$ is the similarity it has with conventional BHF in that it does not lift off the photoresist layer from the wafer surface—which is very desirable for semiconductor manufacturing. For instance, HF peels off the photoresist from wafers, and thereby cannot be used in process steps which utilize photoresist layers on wafer surface. BHF is used instead of HF in conventional processes where photoresist is involved. The proposed ($NH_4$)$HF_2$ recipe does not peel the photoresist, and can thus be used safely.

While the invention has been described with reference to illustrative embodiments, this description is not intended to be construed in a limiting sense. Various other embodiments of the invention will be apparent to persons skilled in the art upon reference to this description. For example, it is envisioned that a wide range of solutions from about 0.049% to 49.0% ($NH_4$)$HF_2$ will effectuate etching. ($NH_4$)$HF_2$ may be premixed with water before being sent to the wafer fab and it may also be mixed on a chemical dock prior to use and thereafter distributed to the fabs on demand. Additionally, As an after mixing at room temperature, applicants' solution may be used for etching at a high temperature (ranging from above room temperature to about 80 C) thus making it compatible with other semiconductor processing steps that occur at high temperatures. It is contemplated that the appended claims will cover the above embodiments and any such modifications as fall within the true scope and spirit of the invention.

What is claimed is:

1. A method of cleaning silicon dioxide, comprising the steps of:

placing a silicon substrate having a silicon dioxide layer on a face thereon into a tank; and directly producing $HF_2^-$ etching species in the tank which etches the silicon dioxide layer.

2. The method of claim 1 wherein the step of directly producing the $HF_2^-$ etching species occurs by mixing ammonium hydrogen bifluoride (($NH_4$)$HF_2$) with water to form a solution.

3. The method of claim 2 wherein the solution ranges from about 0.049% to about 49.0% $(NH_4)HF_2$.

4. The method of claim 3 wherein the solution is maintained at about room temperature.

5. The method of claim 1 wherein the step of directly producing $HF_2$ etching species produces relatively no hydrofluoric acid vapors.

6. A method of etching silicon dioxide, comprising the steps of:

mixing ammonium hydrogen bifluoride with water; and exposing the surface of a wafer having a silicon dioxide layer thereon to the mixture of ammonium hydrogen bifluoride and water.

7. The method of claim 6 wherein the exposure occurs at about room temperature.

8. The method of claim 6 wherein the exposure occurs at temperatures ranging from about room temperature to up to about 80 C.

* * * * *